(12) United States Patent  
Yu et al.

(10) Patent No.: US 7,508,267 B1  
(45) Date of Patent: Mar. 24, 2009

(54) GAN BASED DIGITAL CONTROLLED BROADBAND MMIC POWER AMPLIFIER

(75) Inventors: Mark K. Yu, Coralville, IA (US); Chenggang Xie, Phoenix, AZ (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 11/904,709

(22) Filed: Sep. 28, 2007

(51) Int. Cl.
  *H03F 3/60* (2006.01)
(52) U.S. Cl. .................. 330/286; 330/54
(58) Field of Classification Search .......... 330/286, 330/53–54, 124 R, 295, 310
  See application file for complete search history.

(56) References Cited

U.S. PATENT DOCUMENTS

| 6,794,934 | B2 * | 9/2004 | Betti-Berutto et al. .. 330/124 R |
| 2004/0027202 | A1 * | 2/2004 | Orr et al. .................... 330/286 |
| 2007/0211332 | A1 * | 9/2007 | Smith et al. .............. 359/337.4 |

* cited by examiner

*Primary Examiner*—Robert Pascal  
*Assistant Examiner*—Hieu P Nguyen (57) ABSTRACT

A power amplifier comprises a distributed pre-driver, digital signal adjuster, a distributed high power amplifier; and an integrated coupler-detector unit. The distributed pre-driver, the digital signal adjuster, the distributed high power amplifier and the integrated coupler-detector unit are formed at an interface of a Gallium Nitride layer and an Aluminum Gallium Nitride layer of a monolithic microwave integrated circuit device.

20 Claims, 7 Drawing Sheets

FIG. 9

GAN BASED DIGITAL CONTROLLED BROADBAND MMIC POWER AMPLIFIER

FIELD OF THE INVENTION

The present invention relates generally to power amplifiers. More specifically, the present invention relates to a distributed power amplifier in a monolithic microwave integrated circuit.

BACKGROUND OF THE INVENTION

In microwave systems such as communication systems and phased array antenna systems, microwave circuitry is often implemented in the form of what is commonly known as a microwave monolithic integrated circuit (MMIC). MMICs are a type of integrated circuit (IC) device that operates at microwave frequencies (1 GHz to 300 GHz). An MMIC device typically performs functions such as microwave mixing, power amplification, low noise amplification and high frequency switching. Inputs and outputs on MMIC devices are frequently matched to the standard 50 ohms.

As stated, one function performed by an MMIC device is power amplification. Typically, an MMIC device employs a group of FET based distributed amplifiers to provide broadband amplification. FET based distributed high power amplifiers suffer from large gain variation due to leakage and low early voltage. Such gain variations and leakage may cause degraded linearity and distorted output signals. Linearity is determined by a power amplifier's operating range on a characteristic curve that relates its input to output variables, i.e., the more linear the operating range the more linear the power amplifier is said to be. Linearity is a desired characteristic of a power amplifier. In one aspect, for example, it is desired that a power amplifier uniformly amplifies signals of varying amplitude, and/or phase and/or frequency. Accordingly, linearity is an important determiner of the output signal quality of a power amplifier.

Consequently, a system and method for providing a AlGaN/GaN based digital controlled broadband MMIC power amplifier providing increased linearity and gain control is needed.

SUMMARY OF THE INVENTION

Accordingly, the various embodiments of the present invention are directed to a broadband MMIC power amplifier.

According to a first embodiment, a broadband MMIC power amplifier is disclosed. Power amplifier comprises a distributed pre-driver, further comprising a digital variable attenuator, and a distributed high power amplifier (HPA). Power amplifier also comprises an integrated coupler and detector unit. Pre-driver may be digital and may be suitable for providing extended signal linearity. Power amplifier further comprises a feedback control loop. Feedback control loop comprises an on-chip coupler and voltage detector and is configured to provide a voltage reference to the pre-driver.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to presently preferred embodiments of the invention, examples of which are illustrated in the accompanying drawings.

Figure 1:
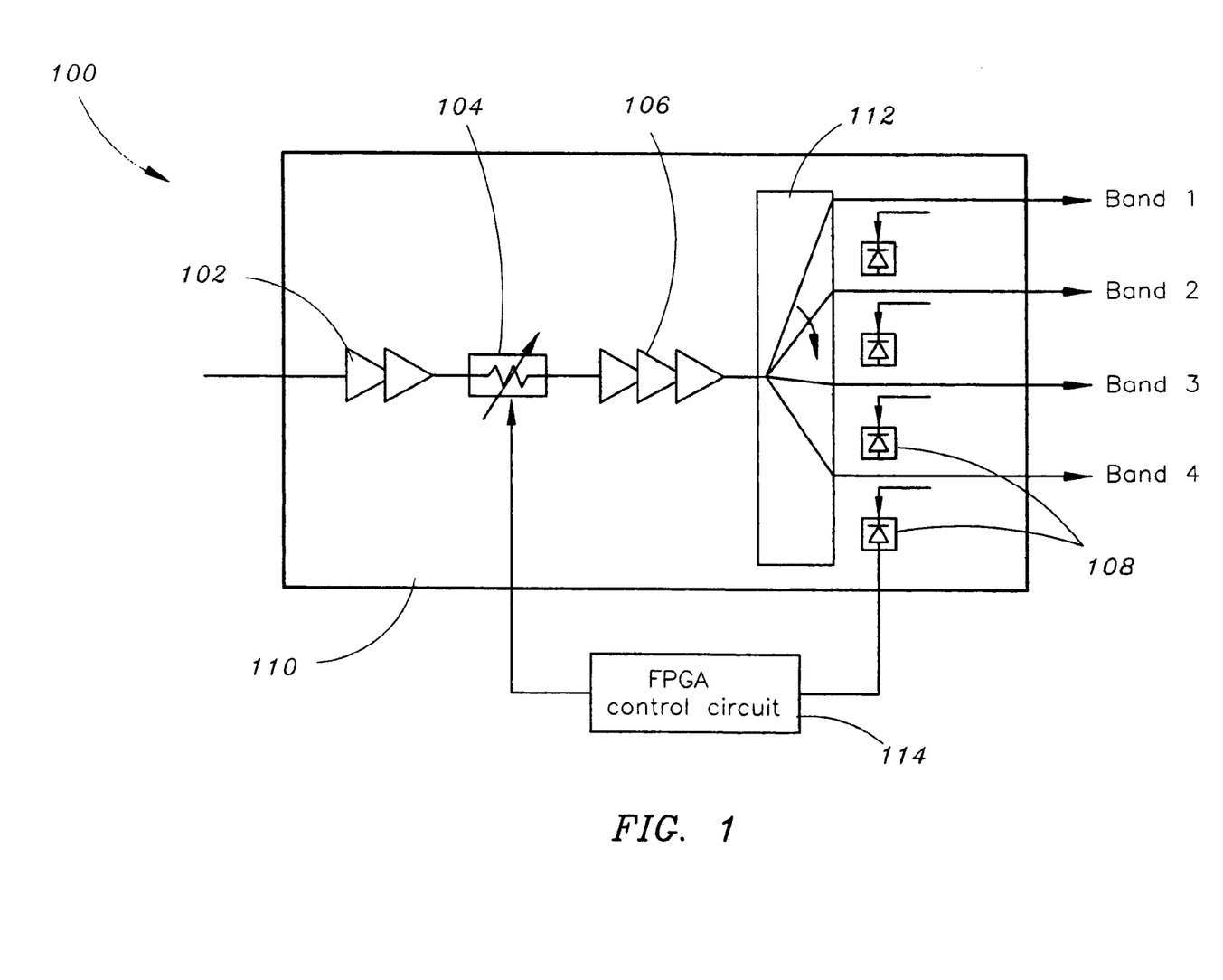
FIG. 1 is a block diagram of a power amplifier according to an exemplary embodiment of the present invention.

Referring now to FIG. 1, a block diagram of a power amplifier 100 according to an exemplary embodiment of the present invention is shown. Power amplifier 100 comprises a distributed pre-driver 102 further comprising a digital variable attenuator 104 and a distributed high power amplifier 106. Power amplifier also comprises and an integrated coupler and detector unit 108. Power amplifier 100 may be suitable for implementation in a monolithic microwave integrated circuit (MMIC) device. Specifically, the semiconductor channel for the power amplifier 100 is formed at an interface 110 of the gallium nitride (GaN) layer and the aluminum gallium nitride (AlGaN) layer. Power amplifier may further comprise a GaN based 1×N switch 112 configured to provide channel selection and a gain control circuit 114. In one embodiment, the power amplifier 100 further comprises a radio and/or microwave frequency (RF/MW) integrated circuit that is included on the monolithic device, such as for amplification. Additional embodiments of the power amplifier 100 may comprise the circuitry described above having an external FPGA control, or may comprise an MMIC power detector.

The distributed pre-driver 102 is configured to provide additional power amplification capability to the amplifier. The distributed pre-driver 102 may be utilized whenever a required output power level may not be achieved in a single amplifying stage. The distributed pre-driver 102 of the present invention may be a digitally controlled broadband pre-driver providing extended linearity. The distributed pre-driver 102 preferably comprises a distributed amplifier and a digital variable attenuator. Digitally controlled pre-driver 102 inside the power amplifier 100 may also suppress the memory effect of the power amplifier 100, thereby achieving excellent linearity with a digital pre-distorter placed within. In order to further improve the linearity performance, linearization techniques, such as feedback, feed forward, or predistortion, may be utilized. Preferably the gain provided by pre-driver 102 is sufficient to drive the final amplifier section to the maximum RF output power when first digitally controlled attenuator is in the minimum attenuation state.

The distributed pre-driver 102 receives a data signal from input and drive the FET gates. The distributed pre-driver 102 may establish the necessary level shifts to drive the gates based on the data input signal. The distributed pre-driver 102 may buffer a received data signal to an output node and may also invert the output signal relative to the input signal. The distributed pre-driver circuit further comprises first and second transistors forming a differential pair that is driven by a differential input voltage.

Power amplifier 100 comprises a digital signal adjuster 104 such as a digital variable amplifier, attenuator, or the like. In a preferred embodiment, the digital signal adjuster is a digital variable attenuator. The distributed pre-driver 102 is configured to supply an output to the digitally controlled signal adjuster 104. Digital signal adjuster 104 is configured to adjust signal level for the input signal based on a digital level control input to obtain an output signal. The signal level of the input signal to, or alternatively, the output signal from, the signal adjuster is compared with the reference signal level to determine whether an adjustment of the digital level control input is needed.

Figure 3:
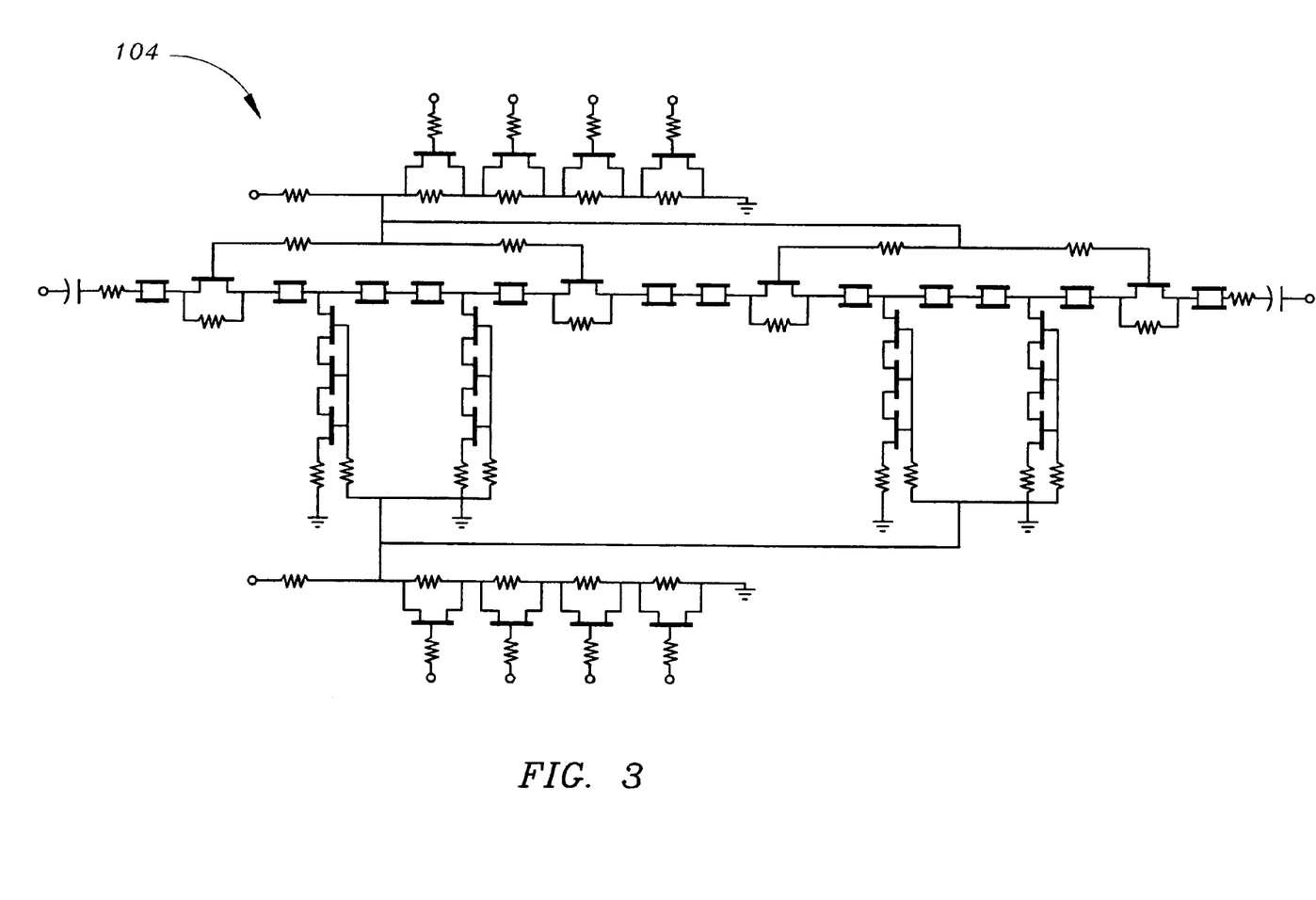
FIG. 3 is a schematic diagram further illustrating analog/digital-controlled attenuator topology for a GaN based analog/digital controlled distributed high power amplifier according to an exemplary embodiment of the present invention.
Figure 6:
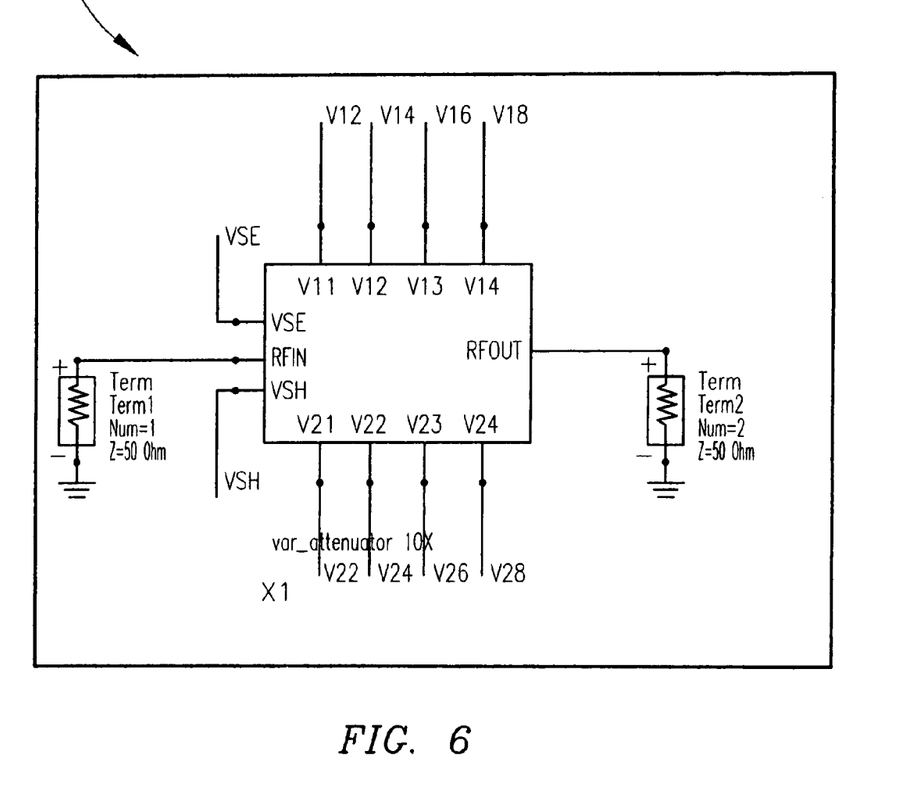
FIG. 6 is a top level schematic diagram with control pin assignment of the analog/digital-controlled attenuator suitable for integration with a power amplifier circuit according to an exemplary embodiment of the present invention.

Referring to FIG. 3, a schematic diagram illustrating analog/digital-controlled attenuator topology 300 for a GaN based analog/digital controlled distributed high power amplifier according to an exemplary embodiment of the present invention. Power amplifier attenuator 104 utilizes GaN switching field effect transistor (FET) technology and may be operable in either digital or analog control modes as desired by a user or required by an operation or application. In a preferred embodiment, attenuator 104 comprises at least eight attenuation states. However, it is contemplated that a power amplifier according to the exemplary embodiments described herein may comprise fewer or greater attenuation states as required by an application or desired by a user. Referring to FIG. 6, a top level schematic diagram 600 with control pin assignment of the analog/digital-controlled attenuator 104 suitable for integration with a power amplifier circuit according to an exemplary embodiment of the present invention is shown. Specifically, bandwidth performance of the attenuator 104 may be improved as shunt FETs device size decreases. Shunt FETs device may be controllable to provide maximum attenuation for a minimum output signal power and minimum attenuation for a maximum output signal power.

As stated, power amplifier 100 may also comprise a control circuit 114 suitable for varying amplitude distortion on the basis of information on the output detector and a gain control unit for providing gain control for the power amplifier 100. The gain control circuit 114 may be a field programmable gate array control circuit, and may be configured to correspond to an output of the power amplifier 100.

Figure 2:
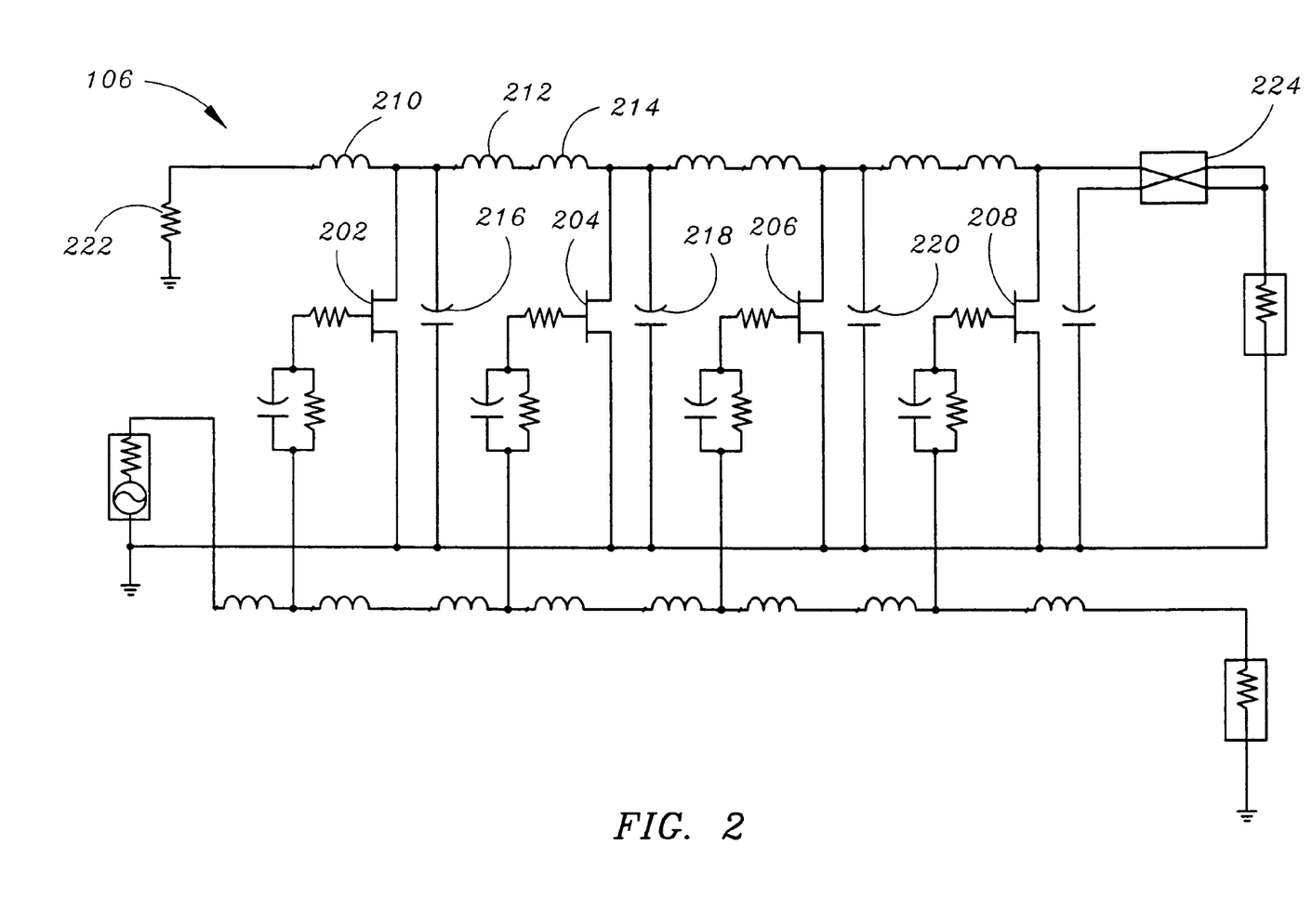
FIG. 2 is a schematic diagram of a distributed high power amplifier according to an exemplary embodiment of the present invention.

Referring to FIG. 2, a schematic diagram of distributed high power amplifier 106 according to an exemplary embodiment of the present invention. The distributed high power amplifier 106 may be qualitatively described as a set of artificial input and output transmission lines which are coupled by transconductances such as field effect transistors. It is contemplated that the high power amplifier 106 may be a Doherty, distributed, low noise, high power, trans-impedance, other power combining or other non-power combining amplifier. In the preferred embodiment, the high power amplifier 106 is a distributed high power amplifier, and includes components, such as field effect transistors (FETs) 202, 204, 206, 208, inductors 210, 212, 214, capacitors 216, 218, 220, resistors 222, and at least one coupler 224. Other amplifier components, like matching circuitry (e.g. one or more inductors, resistors and/or capacitors), connected with ground, in feed back loops, to the amplifier input, to the amplifier output or other configurations, switches, combiners, splitters and/or other semiconductor devices may also formed in semiconductor or other material.

As stated, the distributed high power amplifier 106 comprises an input port, an output port, an input line comprised of a series of high impedance microstrip artificial transmission lines, an output line comprised of a series of high impedance microstrip lines, a plurality of equalizing transmission lines, and a series of periodically spaced FETs 202, 204, 206, 208 which may be connected by electrically short, high impedance microstrip lines and connected in a common-source configuration. An FET device couples an input transmission line to an output transmission line. FET devices may comprise a gate-source capacitance and a drain-source capacitance. The drains may be coupled to output transmission lines, and the sources may be coupled to ground. The drains of each FET are connected by microstrip lines to junction nodes between the microstrips of the output line, and the gates are connected by connecting lines to junction nodes between the input line microstrips. The gate-source capacitances periodically load input transmission line, while the drain-source capacitances periodically load output transmission line. The drain-source capacitances of the FET devices are not always sufficient to equalize the characteristic impedances and velocities of the transmission lines, therefore equalizing transmission lines are sometimes put in series with the drain-source capacitances. It is well-known to model the transmission lines as a series of periodic series inductances and shunt capacitances. Thus, input transmission line includes input inductances associated with FET gate to source capacitances, and output transmission line includes output impedances associated with FET drain to source capacitances. The terminations and are standard and well known in the art, and various gate and drain biasing circuits may be used.

The high power amplifier circuit 106 may comprise a coupler 224. Due to the nature of a distributed power amplifier, sampling power output may be achieved by replacing the last inductor, i.e., the inductor positioned in closest proximity to the power output, with a coupler 224. The design of the coupler 224 may be determined by the requirements of the coupler 224 as well as the requirements of the distributed power amplifier 106.

The distributed high power amplifier 106 of FIG. 2 may utilize microstrip transmission lines, lumped inductance transmission lines, capacitance transmission lines or any other transmission line suitable for implementation in a high power amplifier circuit. In one embodiment, transmission lines of the distributed high power amplifier 106 may be LC-lumped transmission lines. In a distributed power amplifier having LC-lumped transmission lines, the parasitic of the active elements may be absorbed into an LC-lumped transmission line. LC lumped-elements are loaded on a conventional microstrip to fabricate the CRLH transmission line. Drains of FETs are connected with inductors, each of which may be a spiral inductor or a microstrip inductor formed from a spiral shaped conductive path of material on a dielectric. In this embodiment, the coupling of the FET drain and the inductor forms an artificial transmission line.

In one embodiment, the power amplifier FETs are formed on a GaN epitaxial wafer. An AlGaN/GaN FET may achieve high output power density under high-current, such as at least 1A/mm and high voltage, such as at least 45V. The AlGaN/GaN FET comprises a monolithic microwave integrated circuit. By realizing the invention on a single MMIC chip, the condition of equal termination impedance is well met over all attenuation conditions because the channel resistance versus gate voltage characteristic of geometrically identical FETs that are physically close to each other on a AlGan/GaN wafer are likely to be very similar. Thus, the invention is inherently impedance matched. The FETs may be connected with metal interconnects and plugs as are known in the art. The interconnects may be formed from aluminum, aluminum-copper alloys, copper, gold or a like metal or metal alloy. The resistors and other circuit components such as line couplers are formed in any of the materials of the monolithic device. The line couplers may be formed by depositing closely spaced metal traces or lines, such as forming a Lange coupler, branch line coupler, ring hybrid coupler or other coupler. The line couplers may also be formed on one or more of the semiconductor or other layers of material. Other combinations of components and/or materials can be used.

Figure 4:
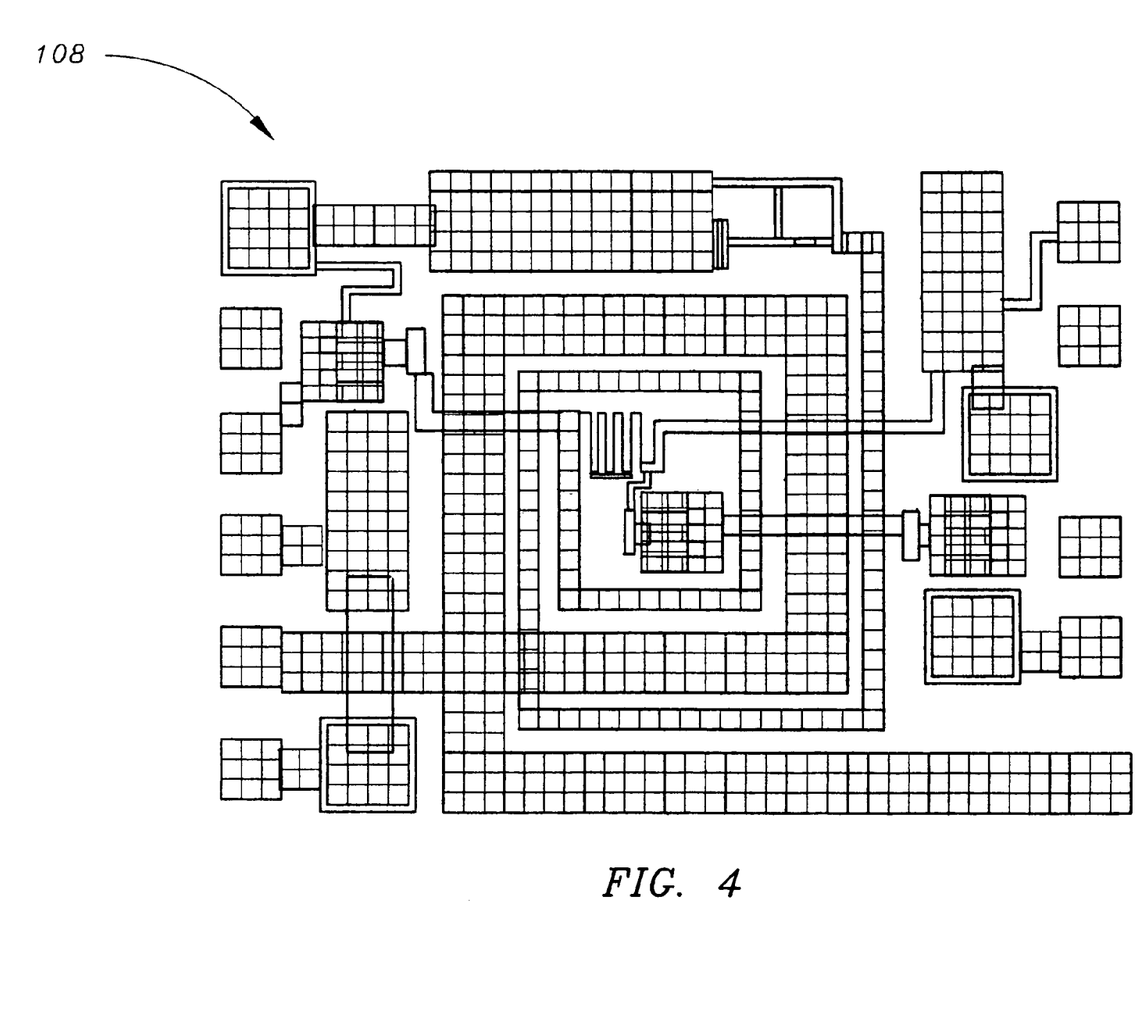
FIG. 4 is a graphical illustration of an integrated coupler-detector unit of a power amplifier circuit according to an exemplary embodiment of the present invention.
Figure 5:
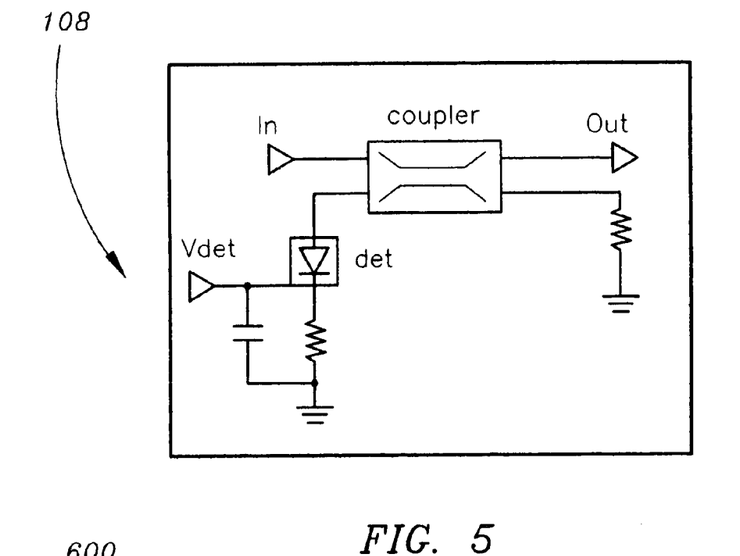
FIG. 5 is a schematic diagram of an integrated coupler-detector unit of a power amplifier circuit according to an exemplary embodiment of the present invention.

Referring to FIG. 4, an integrated on-chip coupler-detector unit 108 of the power amplifier 100 according to an exemplary embodiment of the present invention is shown. Referring to FIG. 5, a schematic diagram of an integrated coupler-detector unit 108 of a power amplifier circuit according to an exemplary embodiment of the present invention is shown. By utilizing an on-chip coupler-detector unit 108 a feedback control loop is formed. Feedback control loop is configured to provide a voltage reference to the broadband pre-driver. Coupler may be a power sensing circuit. The coupler may be configured to detect an output level via a capacitor formed between said coupler portion and a conductor disposed in parallel with an output line formed in a region of the GaN layer, the Al/GaN layer, or the interface of the GaN layer and the Aluminum Gallium Nitride layer. The coupler may utilize a plurality wires to provide cross-over connections in, for example, an interdigitated arrangement, or conventional air-bridge fabrication processing to bridge strip conductors.

Detector of coupler-detector 108 may be an output detector configured to detect the output of the power amplifier 100. For instance, the detector portion of the coupler-detector unit 108 is configured to detect a voltage at an OUT terminal. The voltage detector at output is able to detect over-voltage and under-voltage conditions of power amplifier 100.

Figure 7:
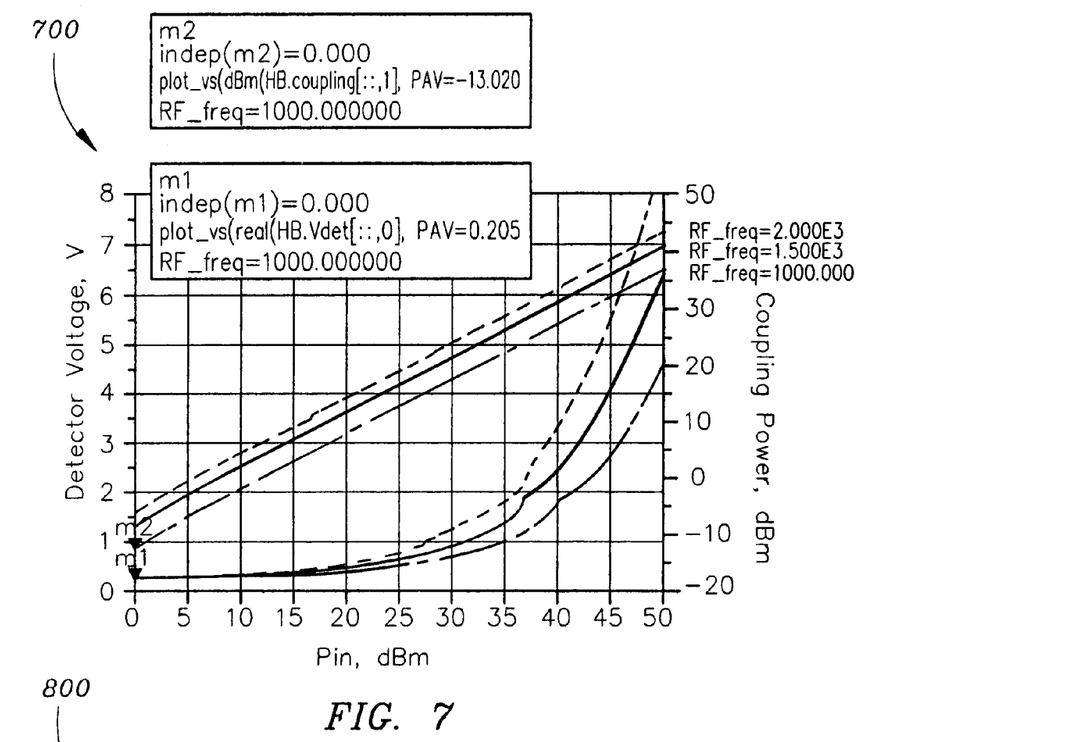
FIG. 7 is a graph illustrating estimated coupling power and detector sensitivity of the integrated coupler-detector unit of the power amplifier according to an exemplary embodiment of the present invention.
Figure 8:
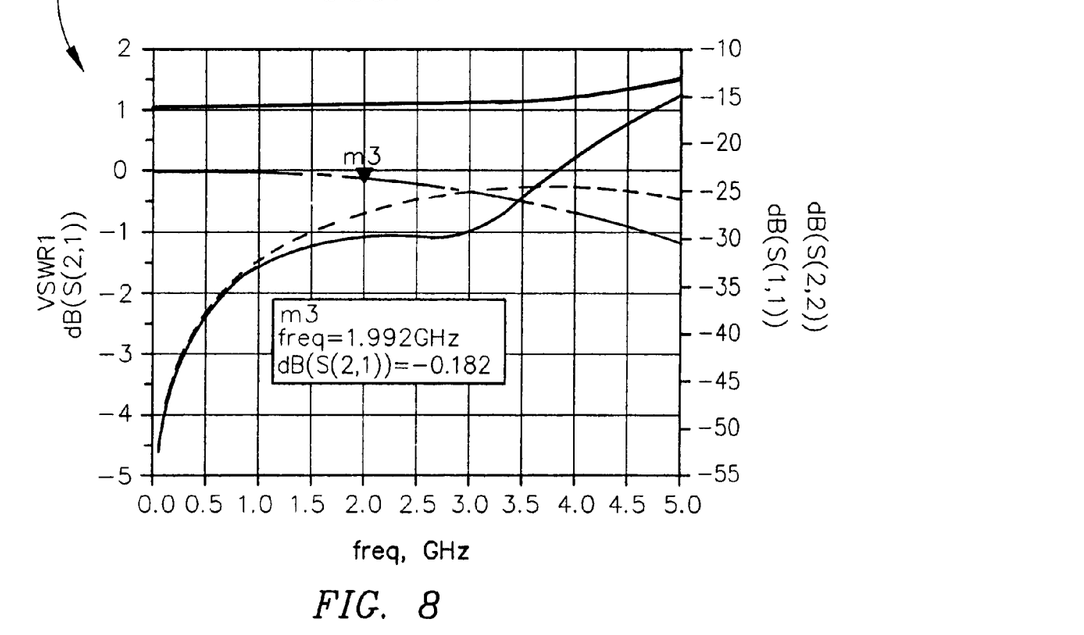
FIG. 8 is a graph illustrating estimated insertion loss performance achieved by the integrated coupler-detector unit of the power amplifier according to an exemplary embodiment of the present invention.

FIG. 7 is a graph 700 illustrating estimated coupling power and detector sensitivity of the integrated coupler-detector unit of the power amplifier according to an exemplary embodiment of the present invention. Specifically, FIG. 7 demonstrates the increase in coupling power and detector sensitivity of a coupler-detector unit in accordance with an exemplary embodiment of the present invention over conventional coupler and detector apparatuses. FIG. 8 is a graph 800 illustrating estimated insertion loss performance achieved by the integrated coupler-detector unit of the power amplifier according to an exemplary embodiment of the present invention. As described above, and shown in FIG. 8, estimated insertion loss performance may be increased over conventional coupler and detector technology by implementing a coupler-detector unit with a power amplifier 100 according to an exemplary embodiment of the present invention.

Figure 9:
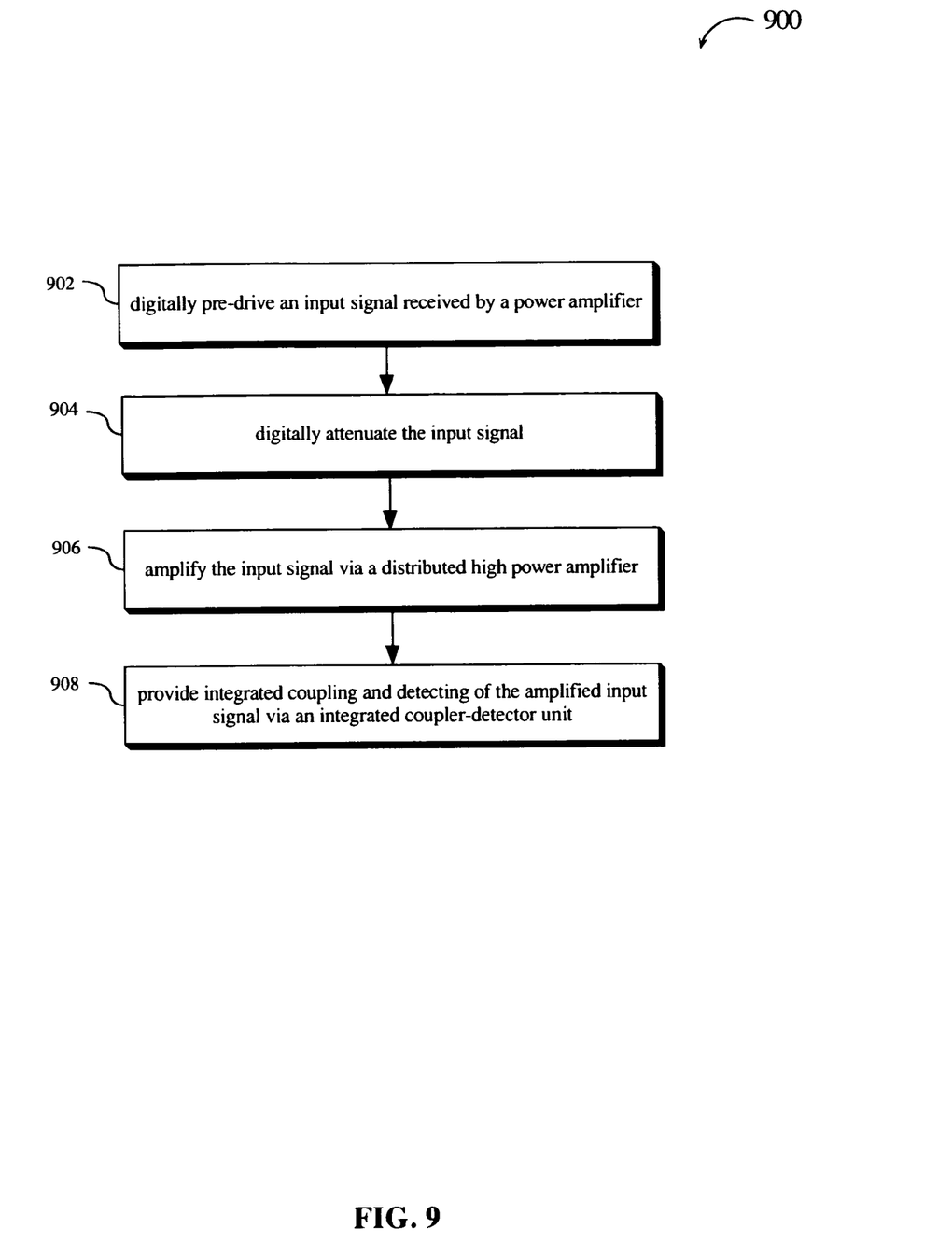
FIG. 9 is a flow diagram illustrating a method for providing power amplification according to an exemplary embodiment of the present invention.

Referring to FIG. 9, a flow diagram illustrating a method 900 for providing power amplification is shown. Method comprises digitally pre-driving an input signal received by a power amplifier 902, digitally attenuating the input signal 904, amplifying the input signal via a distributed high power amplifier 906, and providing integrated coupling and detecting of the amplified input signal via an integrated coupler-detector unit 908. The power amplifier is a monolithic microwave integrated circuit device formed at an interface of a Gallium Nitride layer and an Aluminum Gallium Nitride layer of the monolithic microwave integrated circuit device. The step of digitally attenuating the input signal 904 may be provided by a digital variable attenuator. The step of digitally attenuating 904 the input signal may also comprise adjusting a signal level for an input signal based on a digital level control input. The step of providing integrated coupling and detecting of the amplified input signal via an integrated coupler-detector unit 908 further comprises forming a feedback control loop. Forming the feedback control loop may further comprise providing a voltage reference prior to the digitally pre-driving an input signal received by a power amplifier 902.

It is contemplated that method 900 may be embodied in a system for providing power amplification. System may comprise circuitry for pre-driving an input signal received by a power amplifier, circuitry for digitally attenuating said input signal, circuitry for amplifying said input signal via a distributed high power amplifier, and circuitry for providing integrated coupling and detecting of said amplified input signal via an integrated coupler-detector unit. The circuitry system may form a power amplifier that is a monolithic microwave integrated circuit device formed at an interface of a Gallium Nitride layer and an Aluminum Gallium Nitride layer of said monolithic microwave integrated circuit device.

Systems and apparatuses in accordance with various aspects of the present invention provide an improved high power amplifier. In this regard, the present invention may be described herein in terms of functional block components and various processing steps. It should be appreciated that such functional blocks may be realized by any number of hardware, firmware, and/or software components configured to perform the specified functions. For example, the present invention may employ various integrated circuit components, e.g., memory elements, digital signal processing elements, look-up tables, and the like, which may carry out a variety of functions under the control of one or more microprocessors or other control devices. Such general techniques and components that are known to those skilled in the art are not described in detail herein. Furthermore, although the invention is frequently described herein as pertaining to MMIC devices, it will be appreciated that the systems and methods described herein could also be applied to any power amplifier.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

The invention claimed is:

1. A power amplifier comprising:
   a distributed pre-driver;
   digital signal adjuster;
   a distributed high power amplifier; and
   an integrated coupler-detector unit,
   wherein said distributed pre-driver, said digital signal adjuster, said distributed high power amplifier and said integrated coupler-detector unit are formed at an interface of a Gallium Nitride layer and an Aluminum Gallium Nitride layer of a monolithic microwave integrated circuit device.

2. The power amplifier of claim 1, further comprising a GaN based 1×N switch.

3. The power amplifier of claim 1, wherein the distributed pre-driver is a digitally controlled broadband pre-driver.

4. The power amplifier of claim 1, wherein said digital signal adjuster is a digital variable attenuator.

5. The power amplifier of claim 1, wherein said digital signal adjuster is configured to adjust a signal level for an input signal based on a digital level control input.

6. The power amplifier of claim 1, wherein said digital signal adjuster comprises at least one GaN switching FET device.

7. The power amplifier of claim 1, wherein said distributed high power amplifier comprises a coupler.

8. The power amplifier of claim 7, wherein said coupler is positioned in closest proximity to a power output of said distributed high power amplifier.

9. The power amplifier of claim 1, wherein said integrated coupler-detector unit comprises a coupler portion configured to detect an output level via a capacitor formed between said coupler portion and a conductor disposed in parallel with an output line formed in a region of said interface of said Gallium Nitride layer and said Aluminum Gallium Nitride layer.

10. The power amplifier of claim 9, wherein said coupler portion utilizes a plurality wires to provide cross-over connections or an air-bridge fabrication processing to bridge strip conductors.

11. The power amplifier of claim 1, wherein said integrated coupler-detector unit comprises a detector portion configured to detect an output of said power amplifier.

12. The power amplifier of claim 1, wherein said integrated coupler-detector unit form a feedback control loop.

13. The power amplifier of claim 12, wherein said feedback control loop is configured to provide a voltage reference to said distributed pre-driver.

14. A method comprising:
   digitally pre-driving an input signal received by a power amplifier;
   digitally attenuating said input signal;
   amplifying said input signal via a distributed high power amplifier; and
   providing integrated coupling and detecting of said amplified input signal via an integrated coupler-detector unit,
   wherein said power amplifier is a monolithic microwave integrated circuit device formed at an interface of a Gallium Nitride layer and an Aluminum Gallium Nitride layer of said monolithic microwave integrated circuit device.

15. The amplifier of claim 14, wherein said digitally attenuating said input signal is provided by a digital variable attenuator.

16. The amplifier of claim 14, wherein said digitally attenuating said input signal comprises adjusting a signal level for an input signal based on a digital level control input.

17. The method of claim 14, wherein said providing integrated coupling and detecting of said amplified input signal via an integrated coupler-detector unit comprises forming a feedback control loop.

18. The method of claim 17, wherein said forming said feedback control loop further comprises providing a voltage reference prior to said digitally pre-driving an input signal received by a power amplifier.

19. The method of claim 14, further comprising providing GaN based 1xN switching.

20. A system comprising:
   circuitry for digitally pre-driving an input signal received by a power amplifier;
   circuitry for digitally attenuating said input signal;
   circuitry for amplifying said input signal via a distributed high power amplifier; and
   circuitry for providing integrated coupling and detecting of said amplified input signal via an integrated coupler-detector unit,
   wherein said power amplifier is a monolithic microwave integrated circuit device formed at an interface of a Gallium Nitride layer and an Aluminum Gallium Nitride layer of said monolithic microwave integrated circuit device.

* * * * *